United States Patent [19]

Yamaguchi et al.

[11] Patent Number: 5,038,052
[45] Date of Patent: Aug. 6, 1991

[54] DOUBLE SWING POWER UNIT

[75] Inventors: Satarou Yamaguchi; Ichiro Nakazawa; Minoru Yamane, all of Tokyo, Japan

[73] Assignee: Mitsubishi Denki Kabushiki Kaisha, Tokyo, Japan

[21] Appl. No.: 271,650

[22] Filed: Nov. 16, 1988

[30] Foreign Application Priority Data

Nov. 17, 1987 [JP] Japan .................. 62-288469

[51] Int. Cl.$^5$ .............................. G21B 1/00
[52] U.S. Cl. .......................... 307/108; 376/143
[58] Field of Search ............ 376/142, 143, 133, 121, 376/146, 132; 307/108; 320/1

[56] References Cited

U.S. PATENT DOCUMENTS 3,849,670 11/1974 Lourigan .......................... 307/108
4,079,305 3/1978 Peterson et al. ................... 363/27
4,788,025 11/1988 Oyabu et al. ...................... 376/143

FOREIGN PATENT DOCUMENTS 112495 9/1979 Japan ............................ 376/143
52091 3/1988 Japan ............................ 376/143

Primary Examiner—William H. Beha, Jr.
Attorney, Agent, or Firm—Rothwell, Figg, Ernst & Kurz

[57] ABSTRACT

A double swing power unit for use in a plasma nuclear fusion experimental system comprising a bias bank, a bias switch provided by a semiconductor switch element having a rectifying function, a decoupling inductor, and a load coil connected in series, a series connection of a reverse switch and a reverse bank and a series connection of a hold switch and a hold bank, both thereof being connected in parallel with the load coil, and a control switch connected in parallel with the bias switch.

7 Claims, 5 Drawing Sheets

DOUBLE SWING POWER UNIT

BACKGROUND OF THE INVENTION

1. Field of the Invention

The present invention relates to a double swing power unit for use in a plasma nuclear fusion experimental system.

2. Description of the Prior Art

FIG. 1 is a circuit diagram showing a prior art double swing power supply circuit described in a paper entitled "Current Transformer Coil Power Source for Generating Reversed Magnetic Field Pinched Plasma by Double-Swing Magnetic Flux", the Transactions of the Institute of Electrical Engineers of Japan, Vol. B106, No. 3, pp. 241-248, March 1986. The circuit as shown in FIG. 1 is, in the field of plasma nuclear fusion, in use for a power source on the primary side in transformer coupling with the plasma current for such confinement devices as a tokamak achieving the confinement by passing a plasma current through torus plasma in the torus direction and a reverse magnetic field pinch (hereinafter to be called RFP), for a toroidal coil power source in the RFP, and the like.

Referring to FIG. 1, reference numeral 100 denotes a load coil, 101 denotes a decoupling inductor, 102 denotes a bias capacitor bank, 103 denotes a reverse capacitor bank, 104 denotes a hold capacitor bank, 105 denotes a bias switch, 106 denotes a reverse switch, 107 denotes a hold switch, and 108 denotes a crowbar switch. Incidentally, + and − signs given to each capacitor bank indicate the charged polarity before discharging. The load coil current in the electric circuit is shown in FIG. 2.

Operation will be described with reference to FIG. 1 and FIG. 2. At the start, the capacitors are charged as shown by the signs. Then, first, at the time point $t_0$, the bias switch 105 is closed so that a current is passed through a load coil 100 via the decoupling inductor 101. Then, at the time point $t_1$, the reverse switch 106 is closed and thereby a current from the reverse capacitor bank 103 is started to flow through the load coil 100 in the reverse direction. The decoupling inductor 101 is used so that no large current may flow into the bias capacitor bank 102 at this time. As a result, the load coil current is greatly reduced. Then, at the time point $t_2$, the hold switch 107 is closed.

At this time, if the charged voltages on the hold capacitor bank 104 and the reverse capacitor bank 103 are equal, no current flows there between. And, the current flowing through the load coil 100 is maintained or increased. Finally, at the time point $t_4$, the crow bar switch 108 is closed and the load coil current flows back.

Since prior art double swing power unit was structured as described above, there have been problems such that the current flowing through the load coil is affected by the currents flowing between each of the capacitor banks and that, in order to change the load coil current at a desired time point, an additional capacitor bank must be provided separately.

SUMMARY OF THE INVENTION

The present invention was made to solve the above mentioned problems and it is a primary object of the present invention to provide a double swing power unit made easier in controlling the load coil current and providable at a lower cost.

In order to achieve the above mentioned object, the double swing power unit according to the present invention comprises a bias bank, a bias switch provided by a semiconductor switch element having a rectifying function, a decoupling inductor, and a load coil connected in series, a series connection of a reverse switch and a reverse bank and a series connection of a hold switch and a hold bank both connected in parallel with the load coil, and a control switch connected in parallel with the bias switch.

Thus, the double swing power unit according to the present invention is enabled, by closing the control switch, to let out the electrical energy newly stored, as a result of discharging, on the bias bank in the form of electric current passing through the load coil so that the load coil current may be controlled without the need for providing a new bank.

DETAILED DESCRIPTION OF THE PREFERRED EMBODIMENTS

Figure 1:
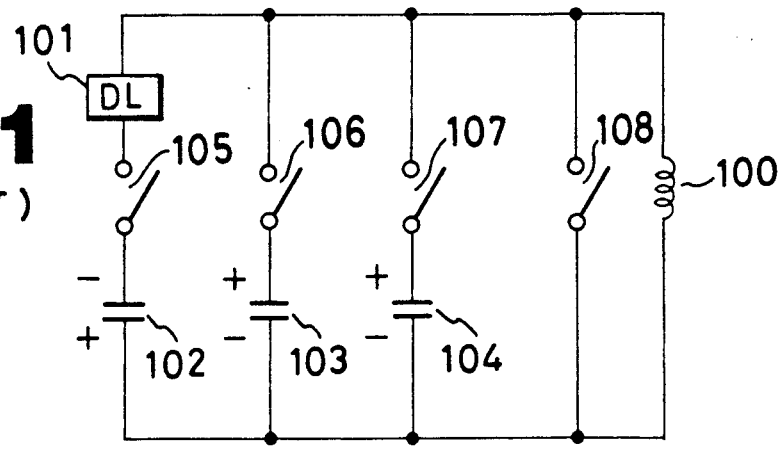
FIG. 1 is a circuit diagram showing an example of prior art double swing power units.
Figure 2:
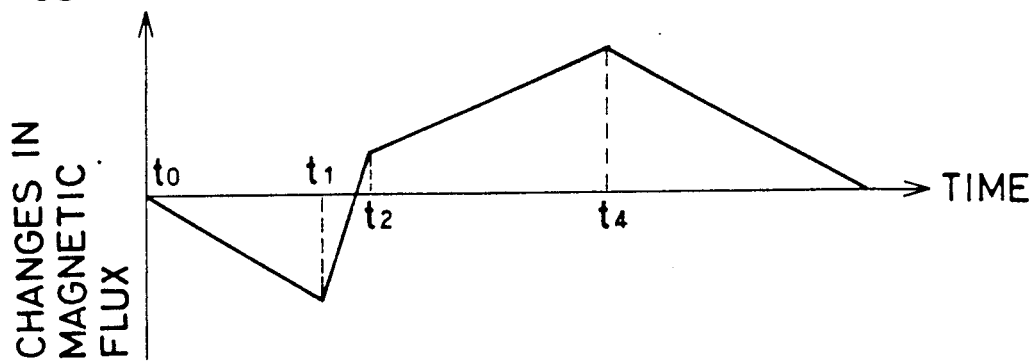
FIG. 2 is a waveform chart of the load coil current for explaining the operation of the unit of FIG. 1.
Figure 3:
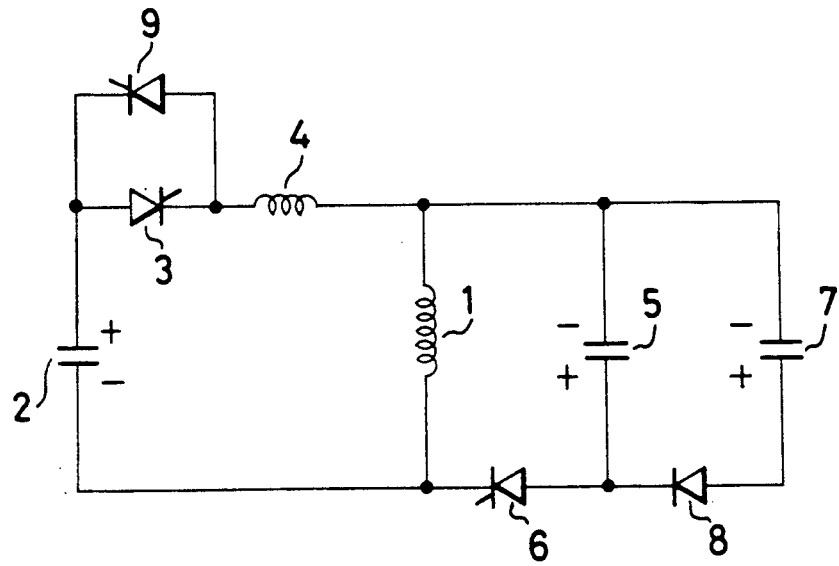
FIG. 3 is a circuit diagram showing a first embodiment of a double swing power unit according to the present invention.

A preferred embodiment of the present invention will be described below with reference to the accompanying drawings. FIG. 3 is a circuit diagram showing a first embodiment of the present invention. Referring to the figure, reference numeral 1 denotes a load coil, 2 denotes a bias capacitor bank, 3 denotes a bias switch having a rectifying function such as an SCR, the anode of the bias switch 3 being connected with one end of the bias capacitor bank 2 and the cathode thereof being connected with one end of the load coil 1 through a decoupling inductor 4. The other end of the bias capacitor bank 2 is connected with the other end of the load coil 1. Reference numeral 5 denotes a reverse capacitor bank and one end of the reverse capacitor bank 5 is connected with the one end of the load coil 1. Reference numeral 6 denotes a reverse switch provided by a semiconductor switch such as an SCR. The reverse switch 6 is connected between the other end of the reverse capacitor bank 5 and the other end of the load coil 1. Reference numeral 7 denotes a hold capacitor bank and one end of the hold capacitor bank 7 is connected with the one end of the reverse capacitor bank 5 and the other end thereof is connected with the other end of the reverse capacitor bank 5 through a hold switch 8 provided by a semiconductor switch such as a diode. Reference numeral 9 denotes a control switch provided by a semiconductor switch such as an SCR and connected in parallel with the bias switch 3. The decoupling inductor 4 is for limiting the current flowing between the bias circuit and the reverse capacitor bank 5 or the hold capacitor bank 7. Although rectifying elements are used for the reverse switch 6, hold switch 8, and the control switch 9, these must not necessarily be rectifying elements but are only required to be switches.

Figure 10:
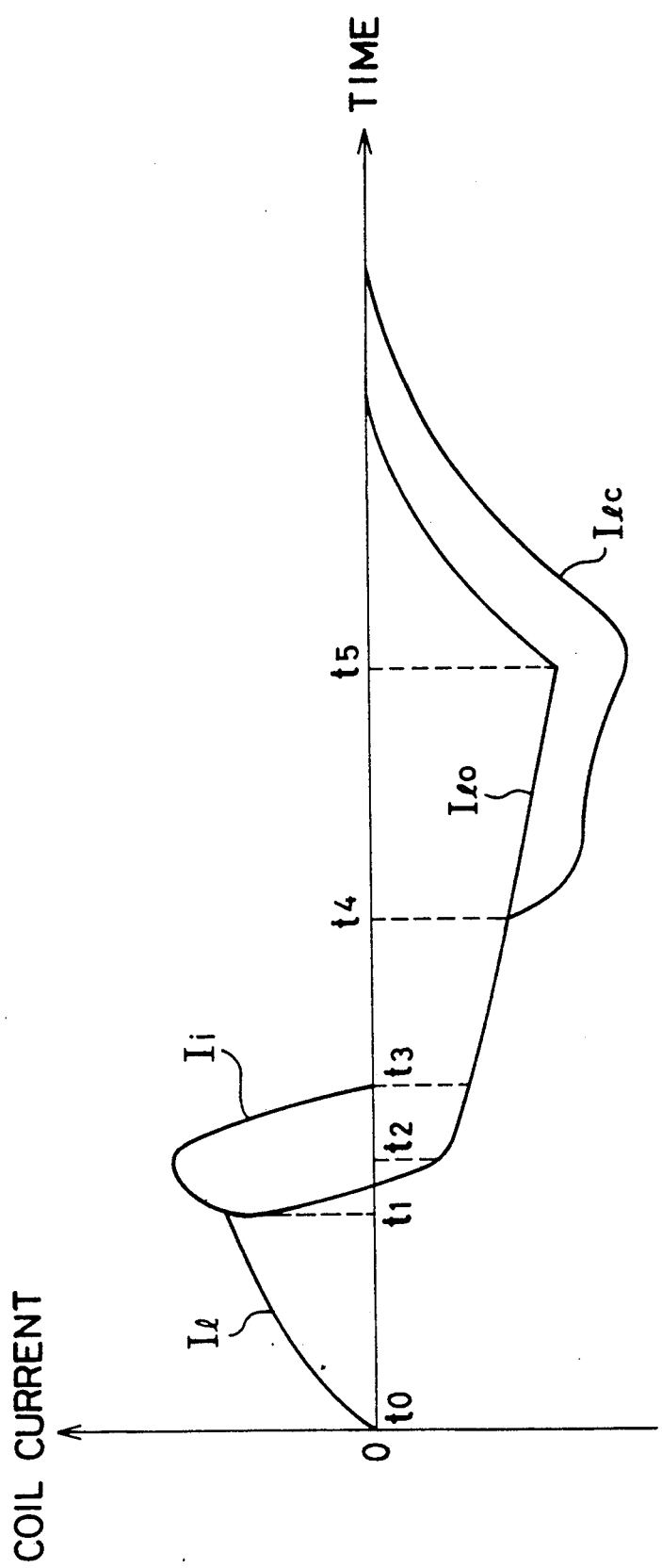
FIG. 10 is a waveform chart of the coil current for explaining the operation of the present invention.

Below will be described the operation. After each of the capacitor banks have been discharged, the bias switch 3 is closed at the time point $t_0$, whereupon a load coil current Il starts to flow through the decoupling inductor 4 and the load coil 1. Then, the reverse switch 6 is closed at the time point $t_1$, whereupon the current in the load coil 1 starts to decrease and at the same time a decoupling inductor current Ii flowing through the decoupling inductor 4 increases. Since a diode is used as the hold switch 8, the hold switch 8 starts to operate when the levels of the voltage on the reverse capacitor bank 5 and that on the hold capacitor bank 7 become equal, at the time point $t_2$. Thereafter, the load coil current Il in the load coil 1 gradually increases. By setting the voltage of the hold capacitor bank 7 at a low level, it becomes possible to keep the load coil current Il virtually constant or make it slowly decrease or increase. Now, the bias circuit consisting of the bias capacitor bank 2 and the decoupling inductor 4 is an LC circuit and the bias switch 3 allows a current to pass therethrough only in one direction, and therefore, as shown in FIG. 10, the decoupling inductor current Ii flowing through the decoupling inductor 4 becomes zero at the time point $t_3$ and thereafter no decoupling inductor current Ii is allowed to flow. That is, the bias capacitor bank 2 comes to be charged to develop a voltage of the reverse polarity to that of the voltage existing thereon before the discharging.

Then, if the control switch 9 is closed at the time point $t_4$ when it becomes necessary to sharply change the load coil current I( in the load coil 1 in order to increase the plasma current or to avoid interruption accident of the plasma current, the electrical energy stored on the bias capacitor bank 2 flows out through the load coil 1. FIG. 10 shows both the waveform of the load coil current I(c obtained when the control switch 9 is closed and the waveform of the load coil current I(o obtained when the same is not closed.

Figure 4:
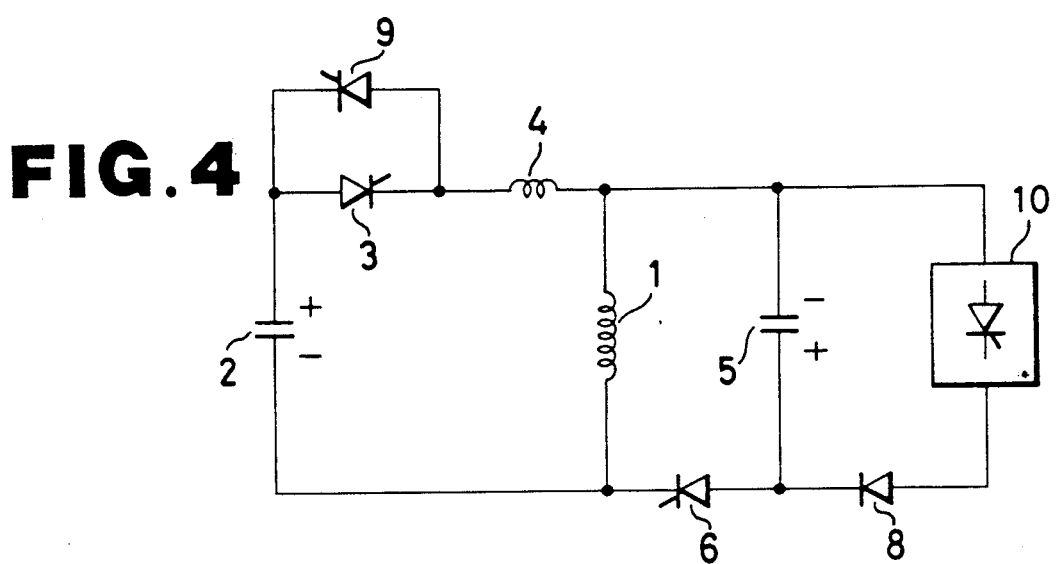
FIG. 4 is a circuit diagram showing a second embodiment of the same.

Although, in the above described embodiment, the power source was structured by the use of the hold capacitor bank 7, the power source may be provided by a controllable power source 10 such as a thyristor and a transistor instead of the capacitor as shown in FIG. 4.

Figure 5:
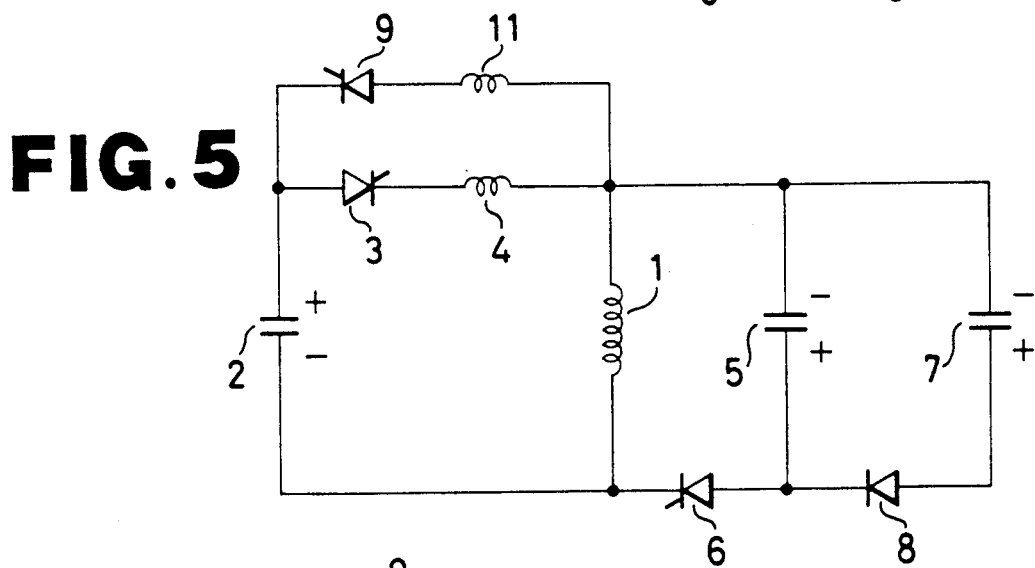
FIG. 5 is a circuit diagram showing a third embodiment of the same.

Although, in the above described embodiment, the arrangement in which the control switch 9 was connected in parallel with the bias switch 3 was shown, such an arrangement in which a series connection of a control switch 9 and a control inductor 11 is connected in parallel with the series connection of the bias switch 3 and the decoupling inductor 4 as shown in FIG. 5 may be use instead, for optimizing the load coil current value after the time point $t_4$.

Figure 6:
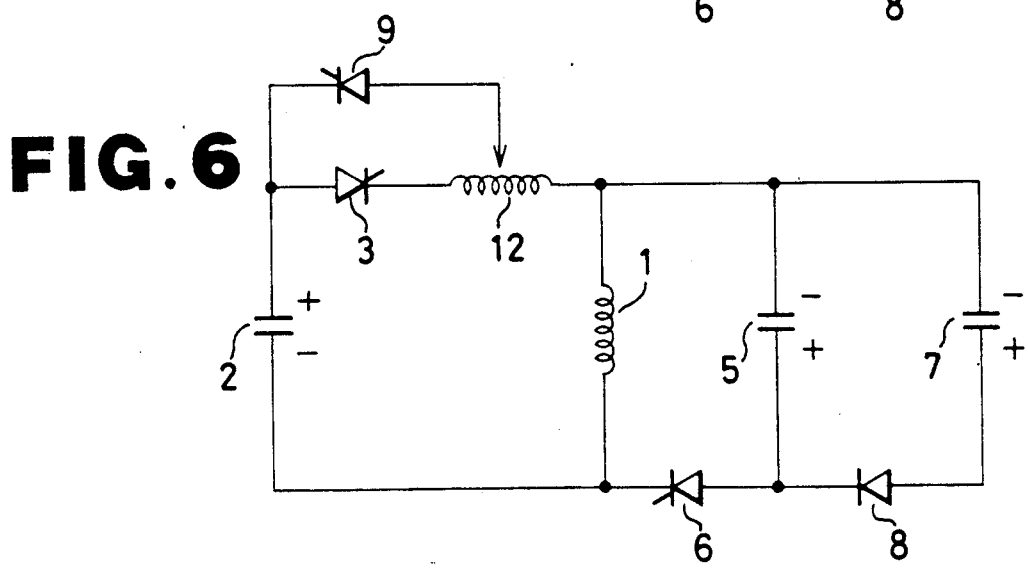
FIG. 6 is a circuit diagram showing a fourth embodiment of the same.

Although, in the above described embodiment, the arrangement in which the bias switch 3 was connected in series with the decoupling inductor 4 was shown, such an arrangement in which a variable inductor 12 is used both as the decoupling inductor and the control inductor for the control switch 9 as shown in FIG. 6 may be used instead.

Figure 7:
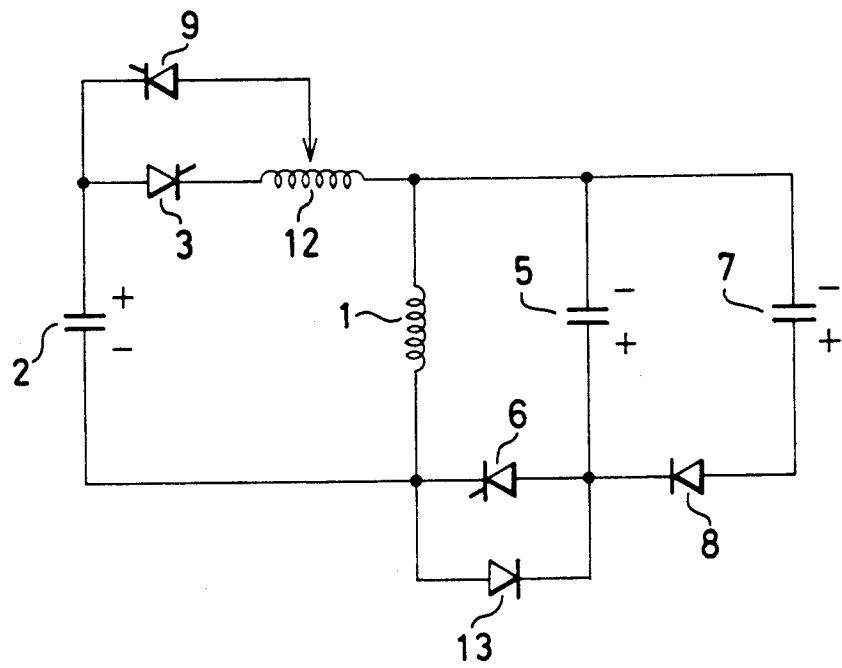
FIG. 7 is a circuit diagram showing a fifth embodiment of the same.

Further, in the above embodiment, a bypass switch 13 having a rectifying characteristic may be put in inverse-parallel connection with the reverse switch 6, as shown in FIG. 7, so that the current flowing from the bias capacitor bank 2 may be shunted to the reverse capacitor bank 5.

Figure 8:
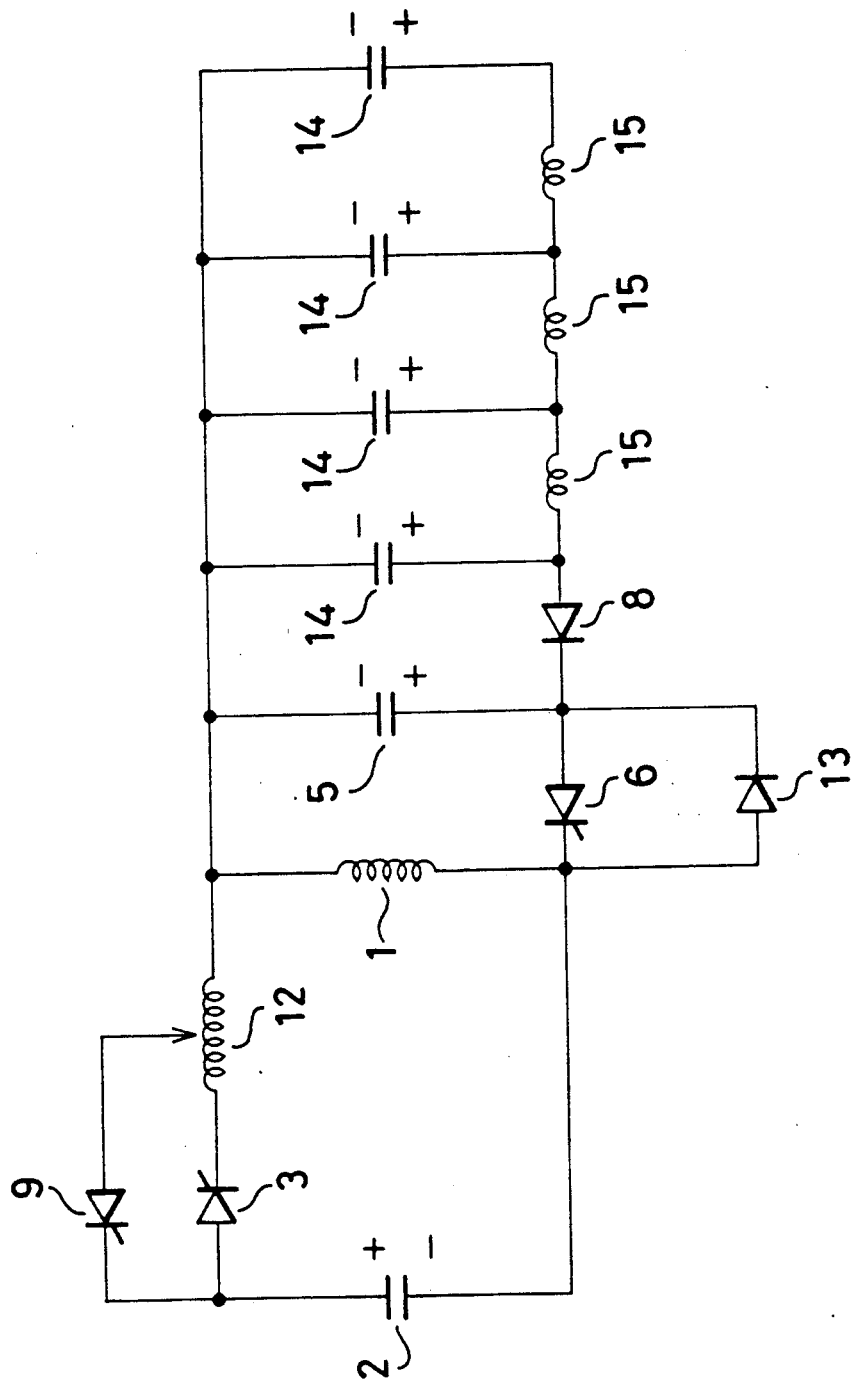
FIG. 8 is a circuit diagram showing a sixth embodiment of the same.

Furthermore, in the above embodiment a pulse generating network may be formed of capacitor banks 14 for pulse generating circuit and inductors 15 for pulse generating circuit and used in place of the hold capacitor bank 7, as shown in FIG. 8, so that a constant current may flow for a longer time.

Figure 9:
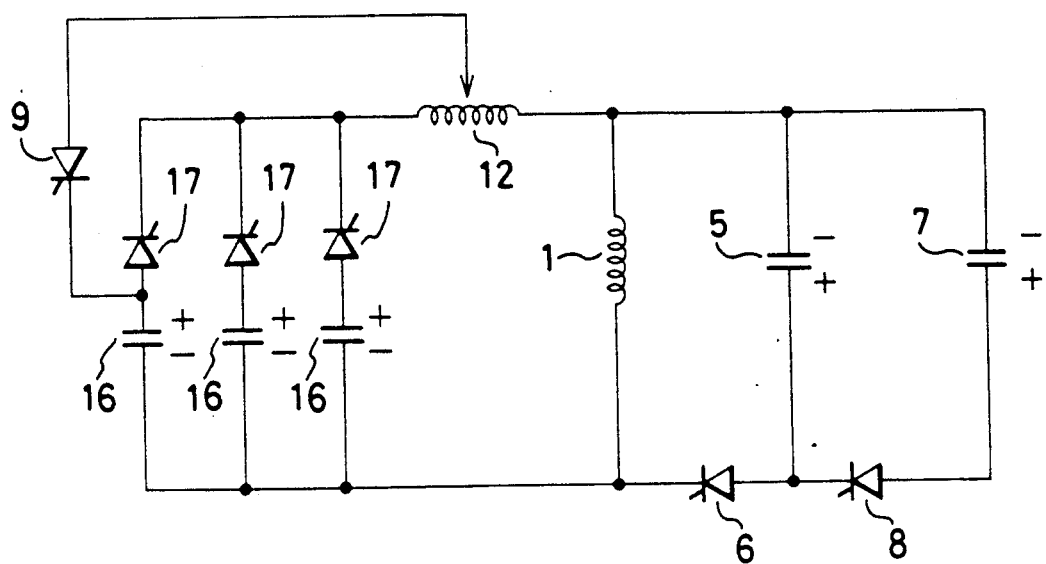
FIG. 9 is a circuit diagram showing a seventh embodiment of the same.

Even if, in the above embodiment, the bias circuit for controlling the load coil current is formed by a parallel connection of a plurality of series connections of split bias capacitor banks 16 and split bias switches 17 and the control switch 9 is connected in parallel with any one of the bias switches 17 as shown in FIG. 9, the same effects as with the above embodiment can be obtained.

As described so far, the double swing power unit according to the present invention is adapted such that electrical energy is stored a new in the bias bank, following the discharging taking place therein, and thereby a current can be passed through the load coil by closing the control switch connected in parallel with the bias switch. Thus, such effects are obtained that the load coil current can be controlled without providing a new bank and the system can therefore be structured at a lower cost.

What is claimed is:

1. In a double swing power unit having a bias bank, a bias switch, a decoupling inductors, and a load coil connected in series, a series connection of a reverse switch and a reverse bank and a series connection of a hold switch and a hold bank, both thereof being connected in parallel with said load coil, said double swing power unit comprising a control switch connected in parallel with said bias switch, wherein said bias switch is provided by a semiconductor switch having a rectifying function, thereby enabling a reverse charge to be held on said bias bank by the blocking rectifying action of said semiconductor switch until said semiconductor switch is electrically bypassed by operation of said parallel connected control switch.

2. The double swing power unit according to claim 1, wherein said hold bank is provided by a controllable power source.

3. The double swing power unit according to claim 1, wherein said control switch is connected to series with a control inductor and this series connection of the control switch and the control inductor is connected in parallel with the series connection of said bias switch and said decoupling inductor.

4. The double swing power unit according to claim 1, wherein said decoupling inductor is provided by a variable inductor.

5. The double swing power unit according to claim 1, wherein said reverse switch is provided by a semiconductor switch having a rectifying characteristic and a bypass switch is connected in inverse-parallel connection with said reverse switch.

6. The double swing power unit according to claim 1, wherein said hold bank is provided by a pulse generating net work formed of capacitor banks for pulse generating circuit and inductors for pulse generating circuit.

7. The double swing power unit according to claim 1, wherein said bias circuit comprises a parallel connection of a plurality of series circuits each of said circuits comprising a bias bank and a bias switch and said control switch is connected in parallel with said bias switch of any of said series circuits.

* * * * *

UNITED STATES PATENT AND TRADEMARK OFFICE
CERTIFICATE OF CORRECTION

PATENT NO. : 5,038,052
DATED : August 6, 1991
INVENTOR(S) : Satarou Yamaguchi et al.

It is certified that error appears in the above-identified patent and that said Letters Patent is hereby corrected as shown below:

```
Column 3, line 15, "Il" should be --Iℓ--;
          line 25, "Il" should be --Iℓ--;
          line 27, "Il" should be --Iℓ--;
          line 41, "I(" should be --Iℓ--;
          line 46, "I(c" should be --Iℓc--;
          line 47, "I(o" should be --Iℓo--;
          line 60, "use" should be --used--.

Column 4, line 21, "a new" should be --anew--;
          line 46, "to" should be --in--.
```

Signed and Sealed this

Seventeenth Day of August, 1993

*Attest:*

BRUCE LEHMAN

*Attesting Officer*    *Commissioner of Patents and Trademarks*